United States Patent
Mitra et al.

[11] Patent Number: 5,994,765
[45] Date of Patent: Nov. 30, 1999

[54] CLOCK DISTRIBUTION NETWORK WITH EFFICIENT SHIELDING

[75] Inventors: Sundari S. Mitra, Milpitas; Aleksandar Pance, Sunnyvale, both of Calif.

[73] Assignee: Sun Microsystems, Inc., Palo Alto, Calif.

[21] Appl. No.: 08/673,490

[22] Filed: Jul. 1, 1996

[51] Int. Cl.$^6$ .......................... H01L 23/552; H01L 23/58; H01L 27/10; H01L 23/48
[52] U.S. Cl. .......................... 257/659; 257/630; 257/208; 257/211; 257/758
[58] Field of Search .................................... 257/659, 630, 257/208, 211

[56] References Cited

U.S. PATENT DOCUMENTS

| | | | |
|---|---|---|---|
| 4,032,903 | 6/1977 | Weimer ..................................... | 257/214 |
| 4,881,250 | 11/1989 | Davids et al. .............................. | 377/60 |
| 5,223,733 | 6/1993 | Doi et al. .................................. | 257/386 |
| 5,309,015 | 5/1994 | Kuwata et al. ........................... | 257/659 |

*Primary Examiner*—Teresa M. Arroyo
*Attorney, Agent, or Firm*—The Gunnison Law Firm

[57] ABSTRACT

An interconnect structure includes in a first layer a clock line and a ground line running substantially parallel to the clock line, and a plurality of conductive regions lying in a second layer parallel to the first layer. The ground line is coupled to a source of ground potential. The conductive regions are aligned with the clock line and are disposed around a signal line routed in the second layer across the clock line. The conductive regions are electrically connected to the ground line, thereby forming a shield for the clock line that helps prevent clock signals propagated on the clock line from electromagnetically coupling with other signal lines. In one embodiment, a clock distribution network includes conductive regions (501, 503, 505. . . ) in the metal layer below the clock line layer and two parallel ground lines (201, 203) in the same metal layer as the clock line (101). The conductive regions (501, 503, 505 . . .) are electrically connected to the ground lines (201, 203) with vias (603A, 603B, 605A, 605B . . . ). In the same metal layer as the conductive regions, conductive signal lines (509, 511) are routed between the regions (501, 503, 505, 507. . . ) to cross below the clock line. The conductive regions (501, 503, 505, 507. . . ) form a shield between the clock line (101) and any signal lines (105) routed in the next metal layer adjacent to the metal layer containing the conductive regions.

11 Claims, 2 Drawing Sheets

CLOCK DISTRIBUTION NETWORK WITH EFFICIENT SHIELDING

FIELD OF THE INVENTION

The present invention is related to clock distribution networks, and more particularly, to clock line shielding for multi-level clock distribution networks.

BACKGROUND

Clock signals are typically routed to various clocked circuit elements within a large circuit through a clock distribution network. In general, large drivers or buffers capable of providing large currents are used by the network to transmit the clock signals to the clocked circuit elements. Because large currents are used, the clock signals can couple to signal lines running parallel to the clock line. As a result, the clock signal can inject spurious signals or other noise into these signal lines.

In many conventional clock distribution networks, the clock lines are shielded to reduce the aforementioned coupling. Shielding is typically accomplished by routing ground lines parallel to the clock lines. In addition, in a multi-layer interconnect structure, ground lines parallel to the clock line are routed in the layers above and/or below the layer containing the clock line. For example, FIG. 1 shows a cross-sectional view of a portion of an interconnect structure 100 implemented in an integrated circuit with three metal layers. The interconnect structure 100 includes a clock line 101 in the top metal layer (i.e., the M3 layer). The interconnect structure 100 also includes a shield line 103 in the next lower metal layer (i.e., the M2 layer) that is parallel to and below the clock line 101 in the top metal layer. The shield line 103 is connected to a source of ground potential (not shown) and serves to shield a signal line 105 in the next lower metal layer (i.e., the M1 layer) having a portion running substantially parallel to and below the clock line 101. The ground line 103 helps prevent the coupling of clock signals propagated on the clock line 101 into the signal line 105 and any other signal lines in the M1 layer having a portion running parallel to the clock line 101.

FIG. 2 is a top view of the M3 layer of the portion of the interconnect structure 100 shown in FIG. 1. As shown in FIG. 2, the interconnect structure 100 also includes ground lines 201 and 203 running parallel to the clock line 101. The ground lines 201 and 203 serve to shield the clock line 101, thereby helping prevent coupling of clock signals propagated on the clock line 101 into other signal lines (not shown) located in the same layer (i.e., the M3 layer). In this embodiment, the ground line 103 located beneath the clock line 101 in the M2 layer is slightly greater in width than the clock line 101 and is shown in part with dashed lines.

Referring to FIGS. 1 and 2, because the ground line 103 is substantially continuous and located beneath the clock line 101, other signal lines in the same metal layer as the ground line 103 (i.e., the M2 layer) cannot be routed to cross beneath the clock line 101. As a result, any signal lines that need to cross the clock line 101 must be routed in another metal layer. For example, "crossing" signal lines can be routed in the next lower metal layer, i.e., the layer that contains the signal line 105. Consequently, the clock line 101, in effect, occupies two metal layers, thereby inefficiently utilizing the area available for routing signal lines in the interconnect structure 100. This inefficient routing may undesirably cause the interconnect structure 100 to include an additional metal layer, which increases the complexity and cost of the interconnect structure. Alternatively, the number of signal lines can be reduced, which can undesirably decrease the functionality of the circuitry coupled to the interconnect structure.

SUMMARY

According to the present invention, a method for forming efficient signal line shielding and an interconnect structure formed thereby is provided. In one embodiment, the interconnect structure is formed by routing a first signal line and a ground line running substantially parallel to the first signal line in a layer of the interconnect structure. The ground line is coupled to a source of ground potential. In a second layer of the interconnect structure, a second and third signal line are routed 0to cross the first signal line of the first layer. A plurality of conductive regions are formed in the second layer to be aligned with the first signal line so as to shield the first signal line. In addition, the plurality of conductive regions are located between and around the second and third signal lines in the second layer. The conductive regions are electrically connected to the ground line, thereby forming a shield for the first signal line that helps prevent signals propagated on the first signal line from electromagnetically coupling with other signal lines. Thus, unlike conventional shielding schemes, "crossing" signal lines can be routed in the same plane as the shield, thereby increasing the routing efficiency of the interconnect structure.

In one embodiment adapted for use with a clock distribution network in a multi-metal layer integrated circuit, the first signal line is a clock line. The clock line is routed between parallel ground lines in a first metal layer, whereby the ground lines shield the clock line from other signal lines routed in the first metal layer. In a second metal layer (i.e., a metal layer separated from the first metal layer with no intervening metal layer), signal lines are routed. Some of these signal lines are routed across the clock line. Then conductive regions having a rectangular shape are disposed in the second metal layer directly below and lengthwise perpendicularly to the clock line and ground lines in the first metal layer. The ground lines and the rectangular conductive regions form a structure resembling a railroad with the ground lines in the first metal layer corresponding to the rails and the rectangular regions in the second metal layer corresponding to the ties.

The rectangular conductive regions are electrically connected to the ground lines with conductive vias. Thus, the rectangular conductive regions form a shield between the clock line and any signal lines routed in the third metal layer (i.e., separated from the second metal layer with no intervening metal layer). In the second metal layer, the rectangular conductive regions are placed between the signal lines that are routed across the clock line. As a result, the second metal layer (containing the conductive rectangular regions) can be used to route signal lines across the clock line, unlike conventional shielding schemes in which the shielding in the second metal layer prevents such signal line routing. Accordingly, signal lines can be more efficiently routed in the second metal layer, which can reduce the number of layers needed in the integrated circuit. In a further refinement, the capacitive loading of clock lines in the clock distribution network can be equalized by disposing substantially equal numbers of conductive rectangular regions along each of the clock lines. The equalized number of conductive rectangular regions helps equalizes the capacitive loading of each clock line, thereby reducing clock skew.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 3:
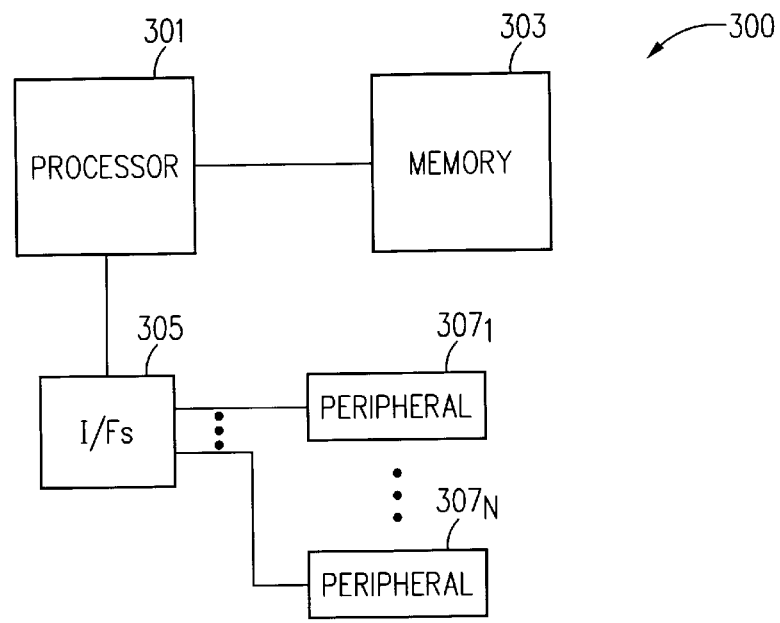
FIG. 3 is a block diagram of an electronic system including an integrated circuit having a clock distribution network according to one embodiment of the present invention.

FIG. 3 is a block diagram of an electronic system 300 having an integrated circuit 301 including a clock distribution network (described below in conjunction with FIGS. 4–6) according to one embodiment of the present invention. The electronic system 300 can be any type of electronic system. In this embodiment, the electronic system 300 is a computer system in which the integrated circuit 301 is a processor connected to a memory 303 and to interfaces 305. The interfaces 305 are connected to peripherals $307_1$–$307_N$, thereby allowing the processor to interact with these peripherals. The memory 303 and the interfaces 305 can be any type of memory or interface for use in computer systems. Likewise, the peripherals can be any type of peripheral such as, for example, displays, mass storage devices, keyboards or any other type of input or input-output device. In accordance with the present invention, the clock distribution network in the integrated circuit 301 includes clock line shielding that allows more efficient utilization of the area used for interconnecting circuitry (e.g., area used for routing signal lines) within the integrated circuit.

Figure 4:
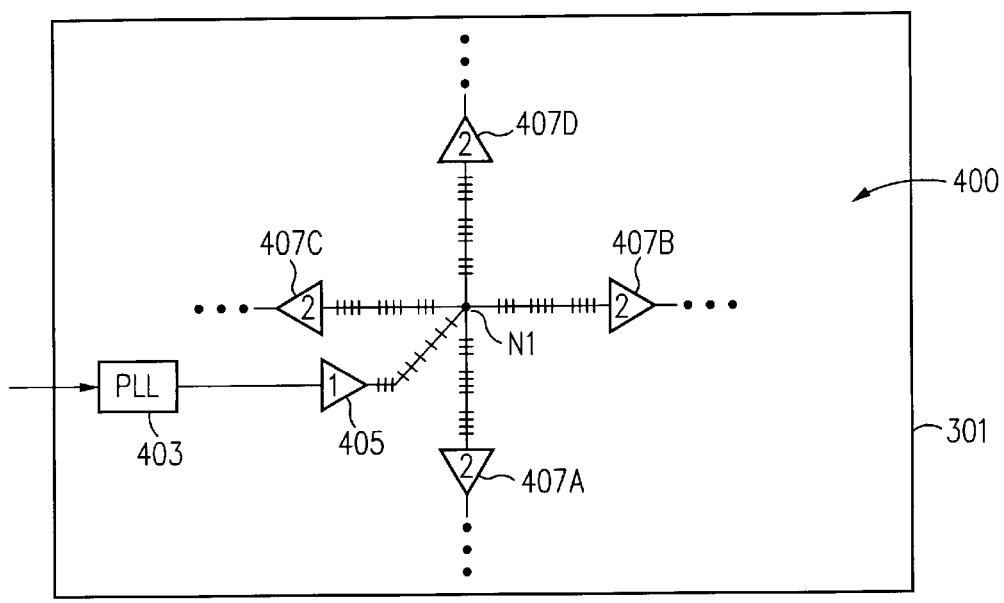
FIG. 4 is a diagram illustrating equalization of the capacitive load of shielded signal lines in an integrated circuit, in accordance with one embodiment of the present invention.

FIG. 4 is a block diagram diagrammatically illustrating a multi-level clock distribution network 400 implemented in the integrated circuit 301 (FIG. 3), in accordance with one embodiment of the present invention. The clock distribution network 400 includes a phase locked loop (PLL) 403 that drives a first-level buffer 405 that, in turn, drives four second-level buffers 407A–407D. The first-level buffer 405 is connected to a node Ni located at roughly the center of the integrated circuit 301, which is connected to the second-level buffers 407A–407D.

The PLL 403 receives a raw clock signal from an external source (not shown) and outputs a clock signal synchronized in some predetermined manner with the raw clock signal. For example, the PLL 403 can output a clock signal at a frequency equal to a multiple of the frequency of the raw clock signal. Each of the four second-level buffers 407A–407D drives one or more third-level buffers (not shown) and so on until, at the final level of the clock distribution network 400, a clock line is connected to substantially every clocked circuit element in the integrated circuit 301.

In this embodiment, substantially every clock line in the integrated circuit 301 is shielded to help prevent clock signals that are propagated on the clock lines from creating noise or spurious signals in other signal lines. As described below in conjunction with FIGS. 5–6, the shielding is implemented in part with rectangular conductive regions disposed on a layer different from the layer containing the clock lines. The rectangular conductive regions are located proximate and lengthwise perpendicularly to each clock line, thereby forming a structure resembling a railroad track. For clarity, only the rectangular conductive regions for the clock lines interconnecting the first level buffer 405 to the four second-level buffers 407A–407D are shown in FIG. 4. As described below, signal lines can be routed in the same layer as and between the rectangular conductive regions, thereby allowing these signal lines to cross the clock lines.

As is known in the art of clock distribution networks, the shielding of a clock line generally increases capacitance of the clock line. Consequently, to equalize capacitive loading between the clock lines from the first-level buffer 405 to each of the second-level buffers 407A–407D, substantially equal numbers of rectangular conductive regions are located proximate to clock line segments connecting the node N1 to the second-level buffers 407A–407D. The numbers of rectangular conductive regions are made substantially equal along each of these clock line segments, even when the number of conductive signal lines crossing these clock line segments is not equal. In a further refinement, the rectangular conductive regions can be located symmetrically along the clock line segments to more closely match the clock signal propagation along these clock line segments.

Figure 5:
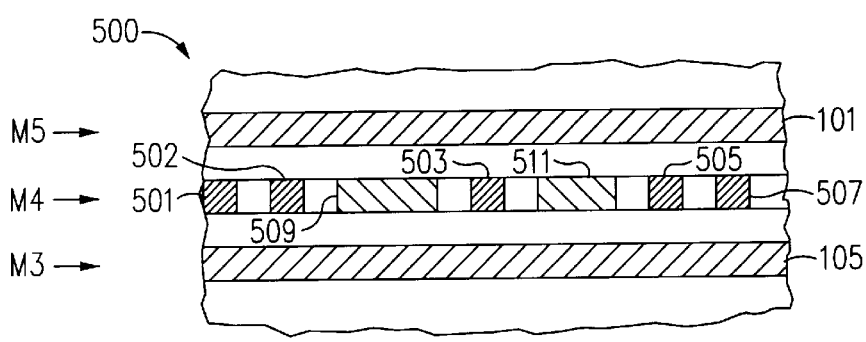
FIG. 5 is a cross-section of a portion of a clock distribution network according to one embodiment of the present invention.

FIG. 5 is a cross-sectional view illustrative of a portion of an interconnect structure 500 having a clock distribution network with clock line shielding according to one embodiment of the present invention. This portion of the interconnect structure 500 is implemented in an integrated circuit having five metal layers and includes the clock line 101 in the top metal layer (i.e., the M5 layer) and the signal line 105 in the M3 layer. In addition, this portion of the interconnect structure 500 includes in the M4 layer rectangular conductive regions 501 to 503, 505, and 507 and conductive signal lines 509 and 511.

In this embodiment, the clock line 101 is disposed in the M5 layer using any suitable integrated circuit fabrication technique. For example, the clock line 101 may be patterned and formed in the M5 layer using conventional photolithographic and deposition processes that are well known in the art of integrated circuit fabrication. In the portion of the interconnect structure 500 shown in FIG. 5, the clock line 101 is shielded with the rectangular conductive regions 501 to 503, 505, and 507; which are electrically coupled to a source of ground potential as described below in conjunction with FIG. 6. It is understood that other rectangular conductive regions (not shown) shield the clock line 101 for substantially the entire route of the clock line 101 and that other signal lines (not shown) may cross beneath the clock line 101. These other signal lines may have different widths than the conductive signal lines 509 and 511.

Figure 1:
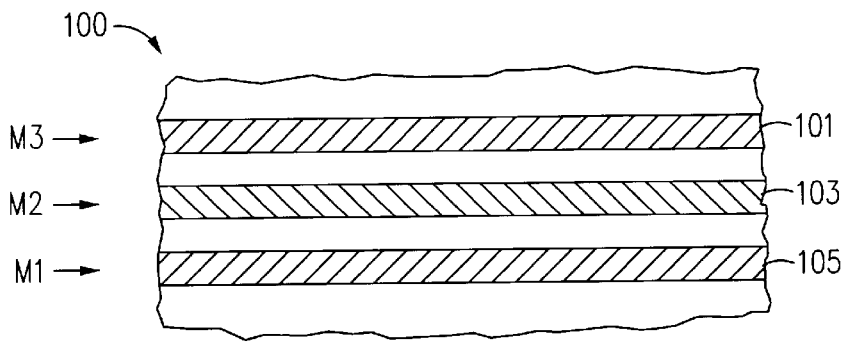
FIG. 1 is a cross-section of a portion of a conventional clock distribution network.
Figure 2:
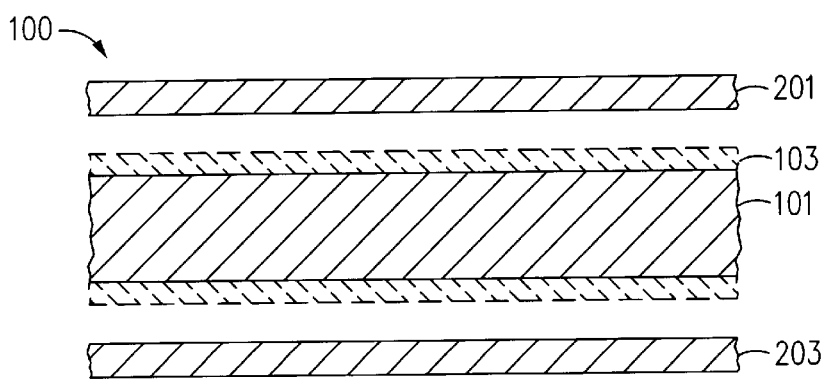
FIG. 2 is a top plan of the portion of the conventional clock distribution network depicted in FIG. 1.

The conductive signal line 509 is disposed between the rectangular conductive regions 502 and 503. The conductive signal line 511 is disposed between the rectangular conductive regions 503 and 505. Of course, other conductive signal lines (not shown) may be routed between other of the aforementioned rectangular conductive regions (not shown) as desired. Similar to the interconnect structure 100 (FIG. 1), the portion of the signal line 105 shown in FIG. 5 is disposed in the M3 layer below and parallel with the portion of the clock line 101. In this position of the interconnect structure 500, the shielding provided by the rectangular conductive regions 501 to 503, 505, and 507 in the M4 layer allows the signal line 105 to be parallel with the clock line 101 with substantially no coupling with clock signals transmitted on the clock line 101.

In this embodiment, the rectangular conductive regions for shielding the clock line 101 are implemented using lines having the minimum width allowed by the fabrication process. In laying out the interconnect structure 500, the clock lines are routed in the M5 layer, and then the signal lines are routed in the M4 layer, with some signal lines crossing beneath the clock line 101. Then the rectangular conductive regions are laid out perpendicularly beneath the clock line 101 between the crossing signal lines, spaced apart from each other and the signal lines using the minimum pitch allowed by the fabrication process. In other embodiments, the width of the conductive regions may be different. For example, the space between consecutive rectangular conductive regions (e.g., rectangular conductive regions 501 and 502) may be filled in with metal to combine these consecutive rectangular conductive regions into one conductive region.

Figure 6:
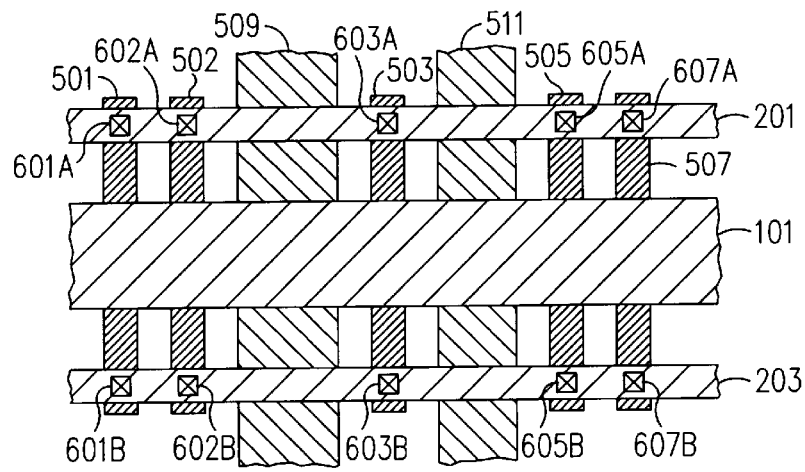
FIG. 6 is a top plan of the portion of the clock distribution network depicted in FIG. 5.

FIG. 6 is a top view illustrative of the portion of the interconnect structure 500 depicted in FIG. 5. The interconnect structure 500 includes the ground lines 201 and 203 disposed on either side of and parallel to the clock line 101. As can be seen in FIG. 6, the signal lines 509 and 511 are disposed perpendicularly to and below the clock line 101 (and the ground lines 201 and 203). The rectangular conductive region 501 is electrically connected to the ground lines 201 and 203 through conductive vias 601A and 601B. Similarly, the rectangular conductive regions 502, 503, 505 and 507 are electrically connected to the ground lines 201 and 203 through pairs of conductive vias 602A and 602B, 603A and 603B, 605A and 605B, and 607A and 607B, respectively. As a result, the grounded rectangular conductive regions 501–507 disposed below the clock line 101 serve as a shield to help prevent noise and spurious signals from clock signals propagated on the clock line 101 from coupling into other signal lines routed in parallel with the clock line 101 in the M3 layer.

Unlike interconnect structures with conventional shielding schemes, an interconnect structure according to the present invention allows signal lines in the same layer as a shield to be routed across shielded lines. Further, because the signal lines are routed perpendicularly to the shielded line, signals propagated on the shielded line do not couple a significant amount of noise into the signal lines. Accordingly, a shielding scheme in accordance with the present invention allows more efficient routing of signal lines in the interconnect structure compared to conventional shielding schemes. Thus, for example, the interconnect structure formed in accordance with this invention may require fewer metal layers for the same number of signal lines than does a conventional interconnect structure.

Although the conductive regions 501 to 503, 505, and 507 are rectangular in the embodiment described above, in other embodiments the conductive regions can be formed in any suitable shape. Further, in other embodiments, the signal line to be shielded can be located in any metal layer and need not be in the top metal layer as in the interconnect structure 500 described above. In light of the present disclosure, those skilled in the art of interconnect structures can easily adapt the interconnect structure 500 to shield a signal line from above without undue experimentation. Thus, for example, an embodiment may have a clock distribution network in the M3 layer of a five metal layer interconnect structure with shielding in both the M4 layer and the M2 layer.

The embodiments of the clock distribution network described above are illustrative of the principles of this invention and are not intended to limit the invention to the particular embodiments described. For example, in addition to integrated circuits, the interconnect structure may be implemented in a printed wiring board, ceramic daughter board or any type of multi-layer interconnect structure. In other embodiments, the shielding scheme can be used for signal lines carrying signals other than clock signals. Accordingly, while a preferred embodiment of the invention has been illustrated and described, it will be appreciated that in view of this disclosure, various changes can be made therein without departing from the spirit and scope of the invention as defined in the appended claims.

The embodiments of the invention in which an exclusive property or privilege is claimed are defined as follows:

1. In an integrated circuit, a signal-line shielding interconnect structure comprising:

a first signal line and a second signal line disposed in a first conductive layer;

a first shield line disposed in said first conductive layer, wherein said first shield line is substantially parallel to said first signal line, and wherein said first shield line is adapted to be coupled to a source of ground potential;

a second shield line disposed in said first conductive layer, wherein said second shield line is substantially parallel to said second signal line, and wherein said second shield line is adapted to be coupled to said source of ground potential;

a plurality of signal lines disposed in a second conductive layer substantially parallel to said first conductive layer, wherein a first subset of said plurality of signal lines in said second conductive layer crosses said first signal line in said first conductive layer, and a second subset of said plurality of signal lines in said second conductive layer crosses said second signal line;

a first plurality of conductive regions in said second layer, wherein said first plurality of conductive regions is substantially aligned with said with said first signal line in said first conductive layer to provide a shield for said first signal line, and wherein said first plurality of conductive regions is disposed about said first subset of said plurality of signal lines in said second conductive layer without contacting any signal line of said first subset of said plurality of signal lines in said second conductive layer; and a second plurality of conductive regions in said second layer, wherein said second plurality of conductive regions is substantially aligned with said second signal line in said first conductive layer to provide a shield for said second signal line, and wherein said second plurality of conductive regions is disposed about said second subset of said plurality of signal lines in said second conductive layer without contacting any signal line of said second subset of said plurality of signal lines in said second conductive layer, and further wherein said first and second pluralities of conductive regions have substantially the same number of conductive regions, and are adapted to be coupled to said source of ground potential.

2. In the integrated circuit, the signal-line shielding, interconnect structure of claim 1 wherein each conductive region of said first plurality of conductive regions is electrically connected to said first shield line.

3. In the integrated circuit, the signal-line shielding interconnect structure of claim 2 further comprising a plurality of conductive vias, wherein each conductive via of said plurality of conductive vias is coupled to said first shield line and a corresponding conductive region of said first plurality of conductive regions.

4. In the integrated circuit, the signal-line shielding interconnect structure of claim 1 wherein said first conductive layer comprises a top metal layer of said integrated circuit.

5. In the integrated circuit, the signal-line shielding interconnect structure of claim 4 wherein said integrated circuit comprises five metal layers.

6. In the integrated circuit, the signal-line shielding interconnect structure of claim 4 wherein said integrated circuit is fabricated using a fabrication process having a minimum line width, and wherein each conductive region of said first and second pluralities of conductive regions are rectangular with a width substantially equal to said minimum line width.

7. In the integrated circuit, the signal-line shielding interconnect structure of claim 6 wherein a subset of said plurality of signal lines in said second conductive layer have a width greater than said minimum line width of said integrated circuit's fabrication process.

8. In the integrated circuit, the signal-line shielding interconnect structure of claim 6 wherein said fabrication process has a minimum pitch, and wherein each conductive region of said first and second pluralities of conductive regions is spaced apart from a neighboring conductive region or signal line in said second conductive layer by a distance substantially equal to said minimum pitch.

9. In the integrated circuit, the signal-line shielding interconnect structure of claim 1 wherein said second metal layer is above said first conductive layer, and said first plurality of conductive regions in said second conductive layer is aligned substantially directly above said first signal line in said first conductive layer.

10. In the integrated circuit, the signal-line shielding interconnect structure of claim 1 wherein said first conductive layer is above said second conductive layer, and said first plurality of conductive regions in said second conductive layer is aligned substantially directly below said first signal line in said first conductive layer.

11. In the integrated circuit, the signal line shielding interconnect structure of claim 1 wherein said integrated circuit is included in a computer system.

* * * * *